(12) United States Patent
Chen et al.

(10) Patent No.: US 6,350,667 B1
(45) Date of Patent: Feb. 26, 2002

(54) METHOD OF IMPROVING PAD METAL ADHESION

(75) Inventors: Sheng-Hsiung Chen, Taichung County; Fan Keng Yang, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/431,152

(22) Filed: Nov. 1, 1999

(51) Int. Cl.[7] .................. H01L 21/44; H01L 21/4763
(52) U.S. Cl. .................. 438/612; 438/614; 438/627; 438/628; 438/644; 438/654; 438/685; 438/687; 438/688
(58) Field of Search .................. 438/612–614, 438/643, 653, 644, 656, 617, 687, 622, 627, 628, 648, 654, 688, 669, 685

(56) References Cited

U.S. PATENT DOCUMENTS

| | | | |
|---|---|---|---|
| 5,547,901 A | 8/1996 | Kim et al. | 437/187 |
| 5,631,498 A | 5/1997 | Anschel et al. | 257/690 |
| 5,668,411 A | 9/1997 | Hong et al. | 257/751 |
| 5,785,236 A | 7/1998 | Cheung et al. | 228/180.5 |
| 5,795,796 A | 8/1998 | Kim | 437/189 |
| 5,904,565 A | 5/1999 | Nguyen et al. | 438/687 |
| 6,016,000 A * | 1/2000 | Moslehi | 257/522 |
| 6,100,195 A * | 8/2000 | Chan et al. | 438/687 |

* cited by examiner

Primary Examiner—Ha Tran Nguyen
(74) Attorney, Agent, or Firm—George O. Saile; Stephen B. Ackerman

(57) ABSTRACT

The present invention is a new and improved method for fabricating aluminum metal pad structures wherein a thin adhesion layer of aluminum is placed in between the underlying copper metal and the top tantalum nitride pad barrier layer providing improved adhesion to the pad metal stack structure. In summary, present invention teaches a method comprising of forming a copper underlayer, forming the key aluminum adhesion layer, forming the tantalum nitride barrier layer, and finally forming the aluminum pad. The problem of adhesion of metal pad to underlying layers, dielectrics, and polymers in is not unique to the manufacture of multi-layer electronic circuit chips and modules, but is encountered in other technologies involved in other types of electronic elements, e.g., the formation of capacitors or even other technologies entirely unrelated to the fabrication of electrical devices. However, since the problems of loss of adhesion are of substantial economic importance at present in the fabrication of multi-layer chips and modules, the present invention is directed to silicon chip technology and IC modules, but can be easily applied to other technologies using these metal pad materials, special (stack) structures.

30 Claims, 2 Drawing Sheets

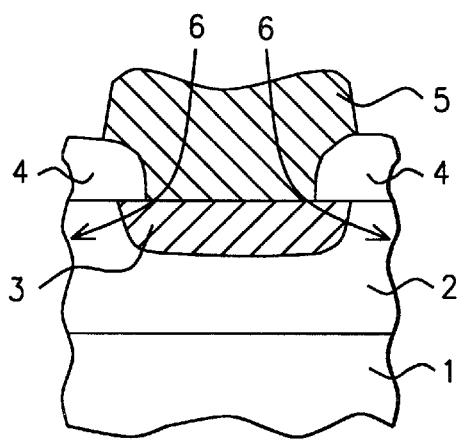
*FIG. 1a – Prior Art*
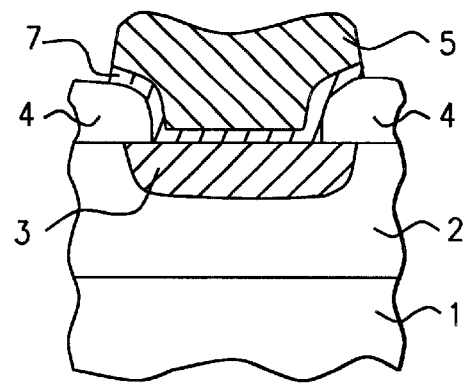
*FIG. 1b – Prior Art*
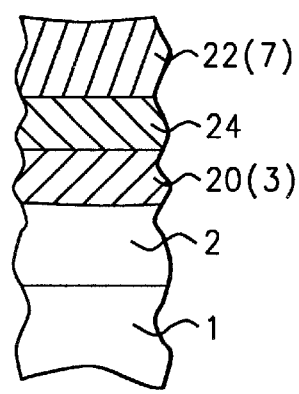
*FIG. 2*

METHOD OF IMPROVING PAD METAL ADHESION

BACKGROUND OF THE INVENTION (1) Field of the Invention

This invention relates to a method of fabrication used for semiconductor integrated circuit devices, and more specifically to the formation of aluminum pad metal structures are described which improve adhesion between the tantalum nitride pad barrier layer and the underlying copper metallurgy. It is the object of the present invention to provide a process wherein a thin adhesion layer of aluminum is placed in between the underlying copper metal and the top tantalum nitride pad barrier layer providing improved adhesion to the pad metal stack structure.

As a background to the current invention, tantalum nitride has been commonly used as the barrier material for copper metallization. The copper metallization process needs an aluminum pad to be transparent with an aluminum metal process. However, if aluminum metal is deposited on top of copper, most of the aluminum is consumed reacting with the underlying copper forming $CuAl_2$. A barrier layer of tantalum nitride is necessary, inserted between the underlying copper and top aluminum pad, to prevent the reaction between these metals. A poor adhesion problem exists between the tantalum nitride barrier layer and the underlying copper because there is no compound formation between copper and tantalum. Therefore, the present invention's key process step is to insert a thin adhesion promoting layer of aluminum in between the underlying copper and the top tantalum nitride barrier layer, chemically reacting and chemically bonding to both layers.

It is a general object of the present invention to provide a novel and improved method for forming aluminum pad metal structures are described which improve adhesion between the tantalum nitride pad barrier layer and the underlying copper metallurgy.

(2) Description of Related Art

The present invention is a new and improved method for fabricating aluminum metal pad structures wherein a thin adhesion layer of aluminum is placed in between the underlying copper metal and the top tantalum nitride pad barrier layer providing improved adhesion to the pad metal stack structure. In summary, present invention teaches a method comprising of forming a copper underlayer, forming a key aluminum adhesion layer, forming the tantalum nitride barrier layer, and finally forming the aluminum pad. Related Prior Art background patents will now be described in this section.

U.S. Pat. No. 5,904,565 (Nguyen et al.) describes an interconnect process with multiple conductive and non-conductive barrier layers. A method of forming a direct, copper-to-copper, connection between levels in an IC is disclosed. A via interconnection is formed by isotropically depositing a barrier material in a via through an insulator to a lower copper level, and then anisotropically etching the via to remove the barrier material covering the lower copper level. The anisotropic etch leaves the barrier material lining the via through the insulator. The subsequently deposited upper metal level then directly contacts the lower copper level when the via is filled. A dual damascene interconnection is formed by etching an interconnection trench in an insulator and anisotropically depositing a non-conductive barrier material in the trench bottom. Then a via is formed from the trench interconnect to a lower copper level. As above, a conductive barrier material is isotropically deposited in the trench/via structure, and anisotropically etched to remove the barrier material covering the lower copper level. The insulating barrier material, lining the trench and via, remains. An IC via interconnection structure and a dual damascene interconnection structure, made in accordance with the above described methods, are also provided.

U.S. Pat. No. 5,795,796 (Kim) shows an Al interconnect with a TaN barrier layer. A method of fabricating a metal line includes the steps of preparing a semiconductor substrate, depositing a first metal on the semiconductor substrate, heat-treating the first metal to form a first metal nitride layer, depositing a second metal on the first metal nitride layer, heat treating the second metal, depositing a third metal on the second metal, and heat treating both the third metal and the second metal to form a metal insulating layer in which the second and the third metals are mixed. The method of fabricating increases the area occupied by the metal line in a contact hole, decreases contact resistance, and increases the speed of the device.

U.S. Pat. No. 5,668,411 (Hong at al.) shows a Al/TaN/Al structure with an anneal step. A diffusion barrier trilayer is comprised of a bottom layer, a seed layer and a top layer. The diffusion barrier trilayer prevents reaction of metallization layer with the top layer upon heat treatment, resulting in improved sheet resistance and device speed.

U.S. Pat. No. 5,785,236 (Cheung et al.) shows an Al pad over a Cu interconnect. A process is provided which enables electrical connection to be formed between gold and aluminum wires and copper interconnects. Conventional techniques for wire bonding are ineffective for bonding gold wires or aluminum wires to copper pads or copper interconnects. A process is provided to modify the copper pads so that conventional wire bonding techniques can be employed. In the process of the present invention an aluminum pad is formed over the copper interconnects. The metal wire is then bonded to the aluminum pad using conventional wire bonding techniques. No new hardware and/or technology is required for the metal wire bonding. No new technology is required to integrate the process of the invention into existing IC fabrication processes.

U.S. Pat. No. 5,547,901 (Kim et al.) shows a Cu wire with an Al oxide containing barrier layer. A method for forming a metal wiring of a semiconductor element, which uses an aluminum film as an oxidation prevention film to prevent oxygen from being diffused into copper contained in the metal wiring. An aluminum oxidation prevention film-layer is selectively formed on an exposed surface of the copper metal wiring layer using a selective chemical vapor deposition method. The width of the aluminum layer formed is below 100 Angstroms, and is converted into aluminum oxide with heat treating or under an atmosphere, thereby preventing the copper from oxidation. A diffusion prevention film between the substrate and the copper metal wiring layer is further included for preventing the copper from diffusing into the substrate.

U.S. Pat. No. 5,631,498 titled "Thin Film Metallization Process For Improved Metal To Substrate Adhesion" granted to Anchel, Ormond and Hayunga on May 20, 1997 describes a metallization layer formed on a substrate with improved adhesion thereto, by performing the deposition at an elevated temperature which favors the formation of chemical bonds of the metal to the substrate as well as clusters of metal embedded within the substrate and contiguous with the metallization layer. In polymer substrates the chemical bond is made to carbonyl functional groups such as ketones or aldehydes. The adhesion is enhanced by the removal of moisture from the surface of the substrate at the elevated temperatures employed. A high degree of adhesion is also obtained through the deposition of a mixture of metals including chromium and copper which initially has a high chromium to copper ratio which is decreased during the deposition process. Completion of the process is determined by the reaching of a final desired chromium to copper ratio as observed by optical emission spectroscopy. The process can be carried out on a continuous basis by the use of a multi-chamber vacuum sputtering system, cluster system or in-line system.

The present invention is directed to a novel and improved method of fabricating metal pad structures. The method of the present invention requires less processing time, has lower cost than conventional methods and produces robust metal pad structures with good adhesion properties and good conductivity.

SUMMARY OF THE INVENTION

It is a general object of the present invention to provide a new and improved method for fabricating aluminum metal pad structures wherein a thin adhesion layer of aluminum is placed in between the underlying copper metal and the top tantalum nitride pad barrier layer providing improved adhesion to the pad metal stack structure. In summary, present invention teaches a robust method comprising of forming a copper underlayer, forming a key aluminum adhesion layer, forming a tantalum nitride barrier layer, and finally forming the aluminum pad.

Provided by Prior Art is a semiconductor silicon substrate (or IC module) with the first level of metal copper wiring being defined, embedded in the first layer of insulator, typically silicon oxide $SiO_X$. The invention starts with these conventional layers being provided by Prior Art methods. Also, provided by Prior Art methods, can be a metal "seed layer" and metal diffusion barrier layer beneath the metal copper wiring layers. In addition, the first level metal is placed on an interlevel dielectric (ILD) insulating layer (or an interconnect line layer, or device contact region to P-N junctions), provided by Prior Art methods.

In addition, provided by Prior Art methods, is another insulator layer which is patterned and defined to provide for a contact via region to the underlying copper metallurgy. In these Prior Art methods, the patterned and defined aluminum pad can be placed directly in contact with the underlying copper. However, these methods have proven deleterious to the pad since aluminum reacts with the copper and is consumed and depleted by forming $CuAl_2$.

In another Prior Art attempt to prevent the deleterious reaction between the top Al pad and bottom Cu, an intermediate metal barrier layer of tantalum nitride, TaN is deposited, patterned and defined. However, this approach results in poor adhesion of the TaN layer to the underlying copper since there is a lack of chemical or alloying (solid state solution) reaction between the TaN layer and Cu.

The key embodiments of this present invention, which solve the deleterious adhesion problems, are now presented. As above, provided are a substrate, with an insulating layer. Also, provided Prior Art methods are an underlying copper layer. Also provided is the deposition, patterning and etching a top insulator for the pad contact region. The key process step to this invention is the deposition, patterning and defining of a thin aluminum layer, approximately from about 50 to 80 Angstroms in thickness, placed directly on top of the underlying copper metallurgy. Next, in the process is the deposition, patterning and defining of a TaN layer, approximately 150 Angstroms in thickness, placed directly on top of the thin aluminum layer. This key layer of thin aluminum, chemically reacts with both the underlying copper to form $CuAl_2$ and with the overlying TaN to from $TaAl_3$. These interactions with both top TaN and bottom Cu provide good adhesion (interface) properties for these pad metal stack layers.

The completed metal pad (stack) structure, including the main embodiments of this present invention, are now summarized. Provided are the substrate, with an insulating layer thereon. The underlying copper layer is provided. The key process step to this invention is the deposition, patterning and defining of a thin aluminum layer, approximately from about 50 to 80 Angstroms in thickness, placed directly on top of the underlying copper metallurgy. Next in the process is the deposition, patterning and defining of a TaN layer, approximately 150 Angstroms in thickness, placed directly on top of the thin aluminum layer. This key layer of thin aluminum chemically reacts alloys with both the underlying copper to form $CuAl_2$ and with the overlying TaN to from $TaAl_3$. These interactions with both top TaN and bottom Cu provide good adhesion (interface) properties for these pad metal stack layers. The final aluminum pad layer is deposited, patterned and defined to form the top metal pad.

The process of the present invention provides robust pad metal (stack) structures that having good adhesion properties (no metal or interface separation/peel failures, interface fracture failures). Since there are a large statistical number of these structures, failure rates must be very low and reliability very high, as tested by wire bond pull tests. Temperature and humidity cycling tests indicate the robustness of the process and structure from stress-crack corrosion, peeling, interface failure, adhesion failures, etc.

A "standard" wire bond pull test structure was used to evaluate the present invention's robust pad structures. For a standard pull test of metal adhesion strength (referred to as a manufacturing use test), an end portion of a 1.28 milli-inch diameter gold wire was bonded to the surface of the aluminum metal pad and tension applied thereto, at an angle of 90 degrees to the surface. The diameter of the wire determines a standardized adhesion strength if the wire is broken first, at the tensile strength of the wire (tensile test), before the pad is pulled away or peeled from the underlying structure. If the wire breaks (tensile pull wire necking) and leaves a bonded portion, "nugget" attached to the pad, then it is considered that sufficient bonding has been achieved to develop adhesion that can withstand repeated thermal, humidity (T&H) and/or mechanical stress of the degree encountered during the testing and manufacturing. However, if a failure occurs between the metal and any interface in the structure (by peeling, fracture, interface failure) at a force less than that required to break the wire, then adhesion is considered to be of a significantly low value which it will be deleterious to the reliability of the product. Wire (bond) pull tests were conducted to a large numbers of pads, to be statistically significant, to prove the robustness of the invention's process and pad (stack) structure for good adhesion properties. (Note for completeness and diligence, low power wire bonding was performed, so as note to influence the pad structure. For more wire bond details, please see "DESCRIPTION OF THE PREFERRED EMBODIMENTS" section.)

In summary, the present invention is a new and improved method for fabricating aluminum metal pad structures wherein a thin adhesion layer of aluminum is placed in between the underlying copper metal and the top tantalum nitride pad barrier layer providing improved adhesion to the pad metal stack structure. In summary, present invention teaches a robust method comprising of forming a copper underlayer, forming a key aluminum adhesion layer, forming the tantalum nitride barrier layer, and finally forming the aluminum pad.

The problem of adhesion of metal pad to underlying layers, dielectrics, and polymers in is not unique to the manufacture of multi-layer electronic circuit chips and modules, but is encountered in other technologies involved in other types of electronic elements, e.g., the formation of capacitors or even other technologies entirely unrelated to the fabrication of electrical devices. However, since the problems of loss of adhesion are of substantial economic importance at present in the fabrication of multi-layer chips and modules, the present invention is directed to silicon chip technology and IC modules, but can be easily applied to other technologies using these metal pad materials and (stack) structures.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include:

FIG. 1a, which in cross-sectional representation illustrates a preliminary Prior Art metal pad method.

FIG. 1b, which in cross-sectional representation illustrates another preliminary Prior Art metal pad method.

FIG. 2, which in cross-sectional representation illustrates a key process step of this invention: the deposition, patterning and defining of a thin aluminum layer, approximately from about 50 to 80 Angstroms in thickness, placed directly on top of the underlying copper metallurgy.

DESCRIPTION OF THE PREFERRED EMBODIMENTS

Figure 3:
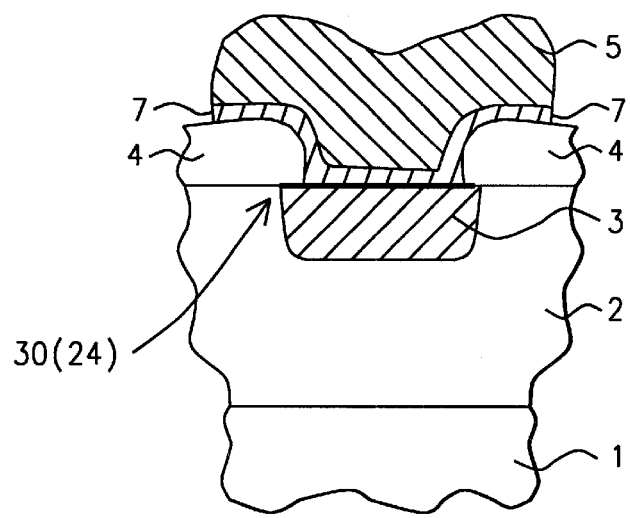
FIG. 3, which in cross-sectional representation illustrates another key process step of this invention: the completion of the metal pad (stack) structure, the preferred embodiments and preferred material stack.

The present invention is a new and improved method for fabricating aluminum metal pad structures wherein a thin adhesion layer of aluminum is placed in between the underlying copper metal and the top tantalum nitride pad barrier layer providing improved adhesion to the pad metal stack structure. In summary, present invention teaches a method comprising of forming a copper underlayer, forming the key aluminum adhesion layer, forming the tantalum nitride barrier layer, and finally forming the aluminum pad.

Referring to FIG. 1a, which in cross-sectional representation, shows a semiconductor silicon substrate 1 (or an IC module) with the first level of metal copper wiring 3 being defined, embedded in the first layer of insulator 2, typically silicon oxide $SiO_x$. The invention starts with these conventional layers being provided by Prior Art methods. Also provided by Prior Art methods, can be a metal "seed layer" and metal diffusion barrier layer beneath the metal copper wiring layers. (These seed and barrier layers are thin film adhesion layers or layer, not shown in the Figs.). In addition, the first level metal 3 is placed on an interlevel dielectric (ILD) insulating layer 2 (an interconnect line layer, or device contact region to P-N junctions), provided by Prior Art methods.

Referring to again to FIG. 1a, provided by Prior Art methods is another insulator layer 4 which is patterned and defined to provide for a contact via region to the underlying copper metallurgy. In these Prior Art methods, the patterned and defined aluminum pad 5 is placed directly in contact with the underlying copper 3, as shown in FIG. 1a. This is deleterious to the pad since aluminum reacts with the copper and is consumed and depleted 6 by forming $CuAl_2$.

Referring to FIG. 1b, in cross-sectional sketch is another method provided by Prior Art. All layers are exactly the same as shown in the related Prior Art FIG. 1a, except an attempt is made to separate the top aluminum pad metallurgy from the underlying copper metallurgy. In attempt to prevent the deleterious reaction between the top Al 5 and bottom Cu 3, an intermediate layer of TaN 7 is deposited, patterned and defined. However, this approach results in poor adhesion of the TaN layer to the underlying copper since there is a lack of chemical or alloying reaction between the TaN layer and Cu.

Referring to FIG. 2, in cross-sectional enlarged sketch of a microscopic region of the pad structure, the key embodiments of this present invention are presented. Provided are the substrate 1, insulating layer 2. The underlying copper layer 20 (3) is depicted. The key process step to this invention is the deposition, patterning and defining of a thin aluminum layer 24, approximately from about 50 to 80

Angstroms in thickness, placed directly on top of the underlying copper metallurgy 20 (3). Next in the process is the deposition, patterning and defining of a TaN layer 22 (7), approximately 150 Angstroms in thickness, placed directly on top of the thin aluminum layer. This key layer of thin aluminum 24 chemically reacts with both the underlying copper 20 (3) to form $CuAl_2$ and with the overlying TaN 22 (7) to from $TaAl_3$. These interactions with both top TaN and bottom Cu provide good adhesion (interface) properties for these pad metal stack layers.

Referring to FIG. 3, in cross-sectional sketch is shown the completed metal pad (stack) structure and the main embodiments of in this present invention. As described in the previous figure, FIG. 2. Provided are the substrate 1, insulating layer 2. The underlying copper layer 3 is depicted. The key process step to this invention is the deposition, patterning and defining of a thin aluminum layer 30 (24), approximately from about 50 to 80 Angstroms in thickness, placed directly on top of the underlying copper metallurgy 3. Also provided is the deposition, patterning and etching a top insulator 4 for the pad contact region. Next in the process is the deposition, patterning and defining of a TaN layer 7, approximately 150 Angstroms in thickness, placed directly on top of the thin aluminum layer. This key layer of thin aluminum 30 (24) chemically reacts with both the underlying copper 3 to form $CuAl_2$ and with the overlying TaN 7 to from $TaAl_3$. These interactions with both top TaN 7 and bottom Cu 3 provide good adhesion (interface) properties for these pad metal stack layers. The finally aluminum pad 5 layer is deposited, patterned and defined to form the top metal pad. This process provide robust pad metal (stack) structure that having good adhesion properties (no metal or interface separation/peel failures, interface fracture failures). Since there are a large statistical number of these structures, failure rates must be very low and reliability very high, as tested by wire bond pull tests. Temperature and humidity cycling tests indicate the robustness of the process and structure from stress-crack corrosion, peeling, interface failure, adhesion failures, etc.

The process steps of this invention can be repeated to form additional multilevel metal pads and interconnects. Materials used for the dielectric layers can be insulating, refractory materials, silicon oxide, silicon nitride or silicon oxynitride.

Figure 4:
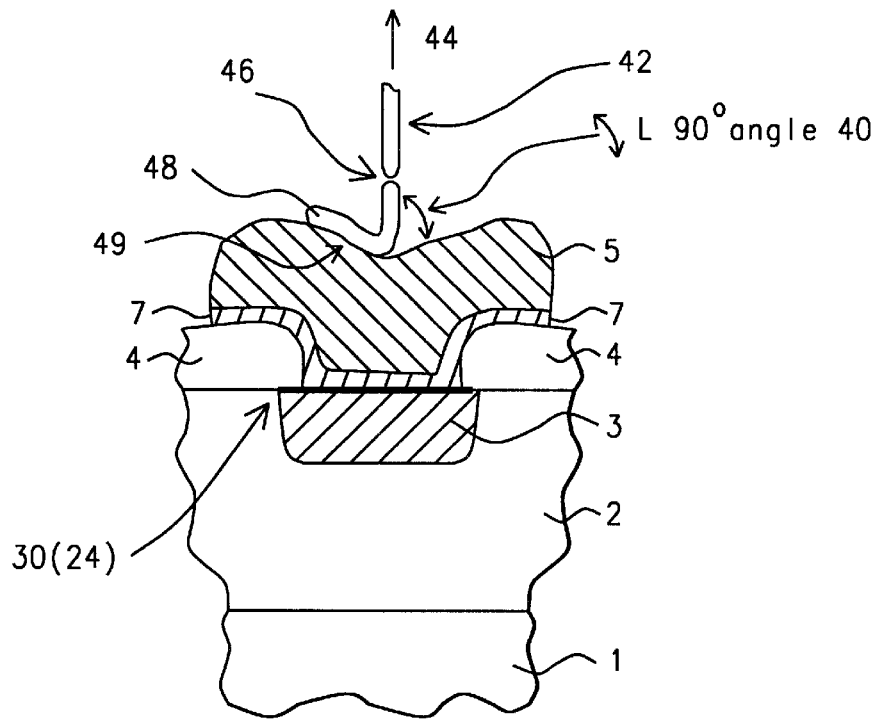
FIG. 4, which in cross-sectional representation of the metal pad region having the preferred embodiments of this invention with preferred material stack layers, illustrating the tensile strength wire (bond) pull test and a "nugget".

Referring to FIG. 4, in cross-sectional view, is sketched a "standard" wire bond pull test structure that was used to evaluate the present invention's robust pad structures. For a standard pull test of metal adhesion strength (referred to as a manufacturing use test), an end portion of a 1.28 milli-inch diameter gold wire 42 was bonded 49 to the surface of the aluminum metal pad 5 and tension 44 applied thereto, at an angle of 90 degrees (40) to the surface. The diameter of the wire determines a standardized adhesion strength if the wire is broken first, at the tensile strength of the wire, before the pad is pulled away or peeled from the underlying structure. If the wire breaks (note wire necking 46), it leaves behind a bonded a portion 48 called a nugget 46 attached to the pad. It is considered that sufficient bonding has been achieved to develop adhesion that can withstand repeated thermal, humidity (T&H) and/or mechanical stress of the degree encountered during the testing and manufacturing. However, if a failure occurs between the metal and any interface in the structure (by peeling, fracture, interface failure), at a force less than that required to break the wire, adhesion is considered to be of a significantly low value, which will be deleterious to the reliability of the product. Wire (bond) pull tests were conducted to a large numbers of pads, to be statistically significant, to prove the robustness of the invention's process and pad (stack) structure for good adhesion properties. (Note for completeness and diligence, low power wire bonding was performed, so as not to influence the pad structure. Wire bonding conditions were: Au wire, 1.28 mils dia., time 20 ms, power 80 mW, force 30 g, temp. 150° C.)

In summary, the present invention is a new and improved method for fabricating aluminum metal pad structures wherein a thin adhesion layer of aluminum is placed in between the underlying copper metal and the top tantalum nitride pad barrier layer providing improved adhesion to the pad metal stack structure. In summary, present invention teaches a robust method comprising of forming a copper underlayer, forming a key aluminum adhesion layer, forming the tantalum nitride barrier layer, and finally forming the aluminum pad.

The problem of adhesion of metal pad to underlying layers, dielectrics, and polymers in is not unique to the manufacture of multi-layer electronic circuit chips and modules, but is encountered in other technologies involved in other types of electronic elements, e.g., the formation of capacitors or even other technologies entirely unrelated to the fabrication of electrical devices. However, since the problems of loss of adhesion are of substantial economic importance at present in the fabrication of multi-layer chips and modules, the present invention is directed to silicon chip technology and IC modules, but can be easily applied to other technologies using these metal pad materials and (stack) structures.

While the invention has been particularly shown and described with reference to the preferred embodiments thereof, it will be understood by those skilled in the art that various changes in form and details may be made without departing from the spirit and scope of the invention.

What is claimed is:

1. A method of fabricating multi-level interconnects in an integrated circuit and other devices on a substrate, the method comprising the steps of:
   (a) providing a substrate or a module;
   (b) providing said substrate with a layer of an interlevel dielectric over the substrate;
   (c) providing a first level metal wiring layer being defined and embedded in a first layer of insulator over the layer of interlevel dielectric;
   (d) depositing a dielectric layer over the defined said first level metal wiring layer;
   (e) patterning and etching said dielectric layer to form an open contact region to the first level metal wiring layer;
   (f) depositing an adhesion layer over said first level metal wiring layer;
   (g) patterning and defining said adhesion layer, then without an intervening step;
   (h) depositing a metal barrier layer over said adhesion layer;
   (i) patterning and defining said metal barrier layer;

(j) depositing a metal layer for metal pad formation over said metal barrier layer;

(k) patterning and defining said metal layer to form metal pads;

(l) repeating the above steps from (a) to (k) to construct multilevel pads and interconnects and form metal pad contact structures for chips and IC's;

wherein said adhesion layer is aluminum from about 50 to 80 Angstroms thick.

2. The method of claim 1, wherein said substrate is a semiconductor consisting of a single crystal of silicon or an IC module.

3. The method of claim 1, wherein said layers of dielectric are selected from the group consisting of insulating, refractory materials, silicon oxide, silicon nitride and silicon oxynitride.

4. The method of claim 1, wherein said layer of first level metal wiring is composed of conducting metal copper.

5. The method of claim 1, wherein the metal barrier layer is composed of tantalum nitride, with a thickness of approximately 150 Angstroms.

6. The method of claim 1, wherein said metal layer for metal pad formation over the metal barrier layer is aluminum.

7. The method of claim 1, wherein the metal pad contact structure formation comprises: forming a copper layer, forming an aluminum adhesion layer over the copper layer, forming a tantalum nitride barrier layer over the adhesion layer, and forming an aluminum pad over the barrier layer.

8. The method of claim 1, wherein the metal pads are made by a process that yields improved adhesion and conductivity, as proven by stress tests that confirmed adhesion properties by wire bond pull tests.

9. The method of claim 1, wherein the metal pads formed for contact in applications selected from the group consisting of chip technology, IC module technology, and solid state devices where an integrated electrical contact is necessary.

10. The method of claim 1 further comprising: repeating the steps from (a) to (l) to form additional levels of multilevel metal pads and interconnects.

11. A method of fabricating an integrated circuit on a substrate, using aluminum metal pad structures wherein an adhesion layer of aluminum is produced, the method comprising the following steps:

(a) providing a silicon substrate or an IC substrate module;

(b) providing said substrate with a layer of interlevel dielectric over the substrate;

(c) providing a first level copper conducting wiring layer being defined and embedded in a first layer of insulator, comprised of silicon oxide, over the layer of interlevel dielectric;

(d) depositing a dielectric layer over the defined said first level copper wiring layer;

(e) patterning and etching said dielectric layer to form an open contact region to the first level copper wiring layer;

(f) depositing an adhesion layer, comprised of aluminum, over said first level copper wiring layer;

(g) patterning and defining said adhesion layer, then without an intervening step;

(h) depositing a metal barrier layer, comprised of tantalum nitride, over said adhesion layer;

(i) patterning and defining said metal barrier layer;

(j) depositing an aluminum metal layer for metal pad formation over said barrier layer;

(k) patterning and defining said aluminum metal layer to form metal pads;

(l) repeating the above steps from (a) to (k) to construct multilevel pads and form metal pad contact structures for chips and IC's;

wherein said adhesion layer is from about 50 to 80 Angstroms thick.

12. The method of claim 11, wherein said substrate is a semiconductor consisting of a single crystal of silicon or an IC module.

13. The method of claim 11, wherein said layers of dielectric are selected from the group consisting of insulating, refractory materials, silicon oxide, silicon nitride and silicon oxynitride.

14. The method of claim 11, wherein said layer of first level copper wiring is composed of conducting metal copper which reacts with the adhesion layer to form $CuAl_2$.

15. The method of claim 11, wherein the metal barrier layer has a thickness of approximately 150 Angstroms.

16. The method of claim 11, wherein said aluminum metal layer for metal pad formation over the metal barrier layer has improved adhesion properties due to the adhesion layer which bonds both the copper wiring and barrier layers together.

17. The method of claim 11, wherein the metal pad contact structure formation comprises: forming a copper layer, forming an aluminum adhesion layer over the copper layer, forming a tantalum nitride barrier layer of a thickness approximately 150 Angstroms over the adhesion layer, and forming an aluminum pad over the barrier layer.

18. The method of claim 11, wherein the metal pads are made by a process that yields improved adhesion and conductivity, as proven by stress tests that confirmed adhesion properties by wire bond pull tests.

19. The method of claim 11, wherein the metal pads are formed for contact in applications selected from the group consisting of chip technology, IC module technology, and solid state devices where an integrated electrical contact is necessary.

20. The method of claim 11 further comprising: repeating the steps from (a) to (l) to form additional levels of multilevel metal pads and interconnects.

21. A method of fabricating an integrated circuit on a substrate, using a method for fabricating aluminum metallurgy pad structure layer and lines, vias and interconnect wiring for MOSFET CMOS, memory and logic devices, the method comprising the following steps:

(a) providing a silicon substrate or an IC substrate module;

(b) providing said substrate with a layer of an interlevel dielectric over the substrate;

(c) providing a first level copper conducting wiring layer being defined and embedded in a first layer of insulator, comprised of silicon oxide, over the layer of interlevel dielectric;

(d) depositing a dielectric layer over the defined said first level copper wiring layer;

(e) patterning and etching said dielectric layer to form an open contact region to the first level copper wiring layer;

(f) depositing an adhesion layer, comprised of aluminum, over said first level copper wiring layer;

(g) patterning and defining said adhesion layer, then without an intervening step;

(h) depositing a metal barrier layer, comprised of tantalum nitride, over said adhesion layer;

(i) patterning and defining said metal barrier layer;

(j) depositing an aluminum metal layer for metal pad formation over said barrier layer;

(k) patterning and defining said aluminum metal layer to form metal pads;

(l) repeating the above steps from (a) to (k) to construct multilevel pads and form metal pad contact, lines and interconnect wiring for chips and IC's;

wherein said adhesion layer is from about 50 to 80 Angstroms thick.

22. The method of claim 21, wherein said substrate is a semiconductor consisting of a single crystal of silicon or an IC module.

23. The method of claim 21, wherein said layers of dielectric are selected from the group consisting of insulating, refractory materials, silicon oxide, silicon nitride and silicon oxynitride.

24. The method of claim 21, wherein said layer of first level copper wiring is composed of conducting metal copper which reacts with the aluminum adhesion layer to form $CuAl_2$.

25. The method of claim 21, wherein the metal barrier layer has a thickness of approximately 150 Angstroms.

26. The method of claim 21, wherein said aluminum metal layer for metal pad formation over the metal barrier layer has improved adhesion properties due to the adhesion layer which bonds both the copper wiring and barrier layers together.

27. The method of claim 21, wherein the metal pad contact formation comprises : forming a copper layer, forming an aluminum adhesion layer over the copper layer, forming a tantalum nitride barrier layer of a thickness approximately 150 Angstroms over the adhesion layer, and forming an aluminum pad over the barrier layer.

28. The method of claim 21, wherein the metal pads are made by a process that yields improved adhesion and conductivity, as proven by stress tests that confirmed adhesion properties by wire bond pull tests.

29. The method of claim 21, wherein the metal pads are formed for contact in applications selected from the group consisting of chip technology, IC module technology, and solid state devices where an integrated electrical contact is necessary.

30. The method of claim 21 further comprising: repeating the steps from (a) to (l) to form additional levels of multilevel metal pads, lines and interconnect wiring.

* * * * *